Sept. 29, 1959 H. E. THOMAS 2,906,895

MAGNETIC PULSE GENERATING CIRCUIT

Filed Jan. 8, 1957 2 Sheets-Sheet 1

Inventor
HARRY E. THOMAS

By [signature]
Attorney

Sept. 29, 1959 H. E. THOMAS 2,906,895

MAGNETIC PULSE GENERATING CIRCUIT

Filed Jan. 8, 1957 2 Sheets-Sheet 2

Inventor
HARRY E. THOMAS

By Percy P. Lantzy
Attorney

United States Patent Office 2,906,895
Patented Sept. 29, 1959

2,906,895

MAGNETIC PULSE GENERATING CIRCUIT

Harry E. Thomas, Montclair, N.J., assignor to International Telephone and Telegraph Corporation, Nutley, N.J., a corporation of Maryland Application January 8, 1957, Serial No. 633,057

5 Claims. (Cl. 307—106)

This invention relates to pulse generator circuits and more particularly to pulse forming magnetic generators.

The use of magnetic generators in pulse forming is not new though not extensively employed. The main element in the process is the saturatable reactor, more commonly known as a pulsactor or thyractor. The saturable reactor has been steadily improved in recent years by the development of high permeability nickel-iron alloys which permit the generation of extremely narrow pulses. Pulse generating circuits in radar equipment, for example, perform the vitally important function of forming the pulse which triggers the magnetron oscillator to generate the high frequency power pulses. The circuits currently used in pulse generators for both high and low power radar sets employ current pulse compression delivering output pulses as narrow as one quarter microsecond pulse width. Radar pulse forming magnetic generators commonly employ sine wave input at the radar repetition frequency. The formation of pulses depends upon the rapid switching action of a saturable reactor at saturation and in the conventional circuit capitalizes on four circuit processes. (1) Self-resonance of the generator input components at the sine wave source of pulse repetition frequency; (2) successive pulsactor switch action in the several cascaded circuits; (3) successive self-resonance of the saturated pulsactors and their associated capacitors; (4) the transfer and wave shaping of pulsed energy resultant to pulsactor switch action from the last resonant circuit to the load.

The conventional pulse forming magnetic generator circuits consist of two or more stages which deliver narrow pulse outputs through the rapid transfer of energy across a series of resonant circuits by means of rapid switching action existing in a saturable reactor. The energy transfer in these circuits occurs at essentially constant voltage but results timewise in a compression of the successive current excursions so that, at constant power, they become increasingly narrow and the resultant pulse under conventional conditions is of triangular shape. In certain radar systems, however, a rectangular shape pulse is required in order to pulse the magnetron of the transmitter. It is clear therefore that most conventional magnetic generators could not be used efficiently in this application.

The pulse forming magnetic generator circuits incorporate polarizing fields in order to utilize most efficiently the magnetic characteristics of the iron used in the pulsactor cores. This necessitates the use of feed chokes series coupled to the polarized winding of the reactors to prevent the alternating current in the reactor being induced in the direct current source supplying the polarizing windings of the reactors. There is, however, a serious defect in the conventional magnetic generators which use separate feed chokes for each reactor. This is the generation of feedback through saturable reactors which enter the input circuits and cause distortion of the input signal. The use of separate feed chokes, as above described, does not counteract this feedback.

It is therefore an object of this invention to provide a pulse forming magnetic generator circuit which will have a rectangular flat top pulse output.

It is further an object of this invention to provide an improved pulse forming magnetic generator to replace conventional pulser types of generators using vacuum tubes.

It is still another object of this invention to provide a magnetic pulse generator circuit to eliminate feedback of output pulse signals into the input circuit.

A feature of this invention is the use of a pulse forming network in a magnetic pulse generator to reshape a triangular pulse signal into a rectangular pulse signal.

Another feature of this invention is the provision of a two section single winding choke in series coupling with the polarizing winding of first and second saturable reactors to develop in response to generation of an output alternating current component in the second saturable reactor a corresponding alternating current component of opposite polarity in the output of the first reactor to counteract feedback of any such generated alternating current component from the second reactor into the input circuit of the magnetic pulse generator.

The above-mentioned and other features and objects of this invention will become more apparent by reference to the following description taken in conjunction with the accompanying drawings, in which.

Figure 1:
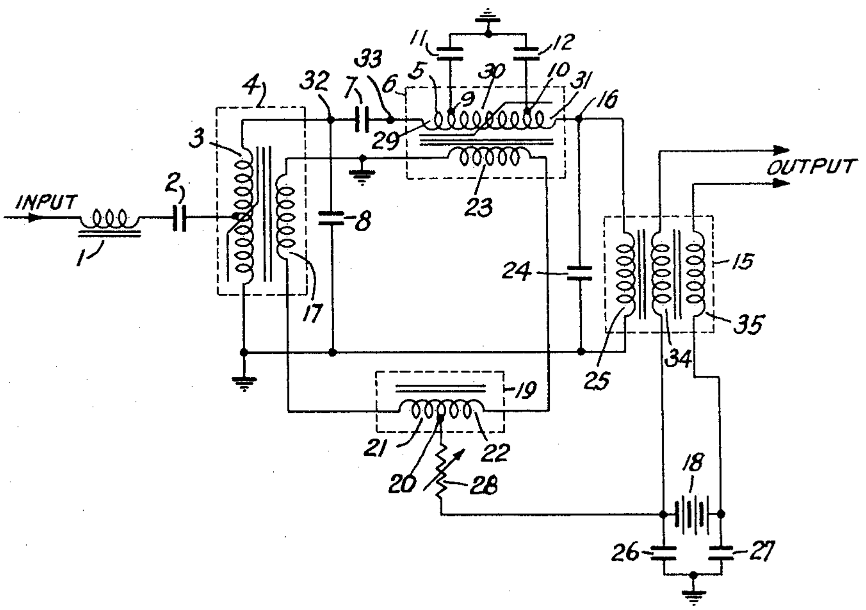
Fig. 1 is a schematic diagram of my invention.
Figure 2:
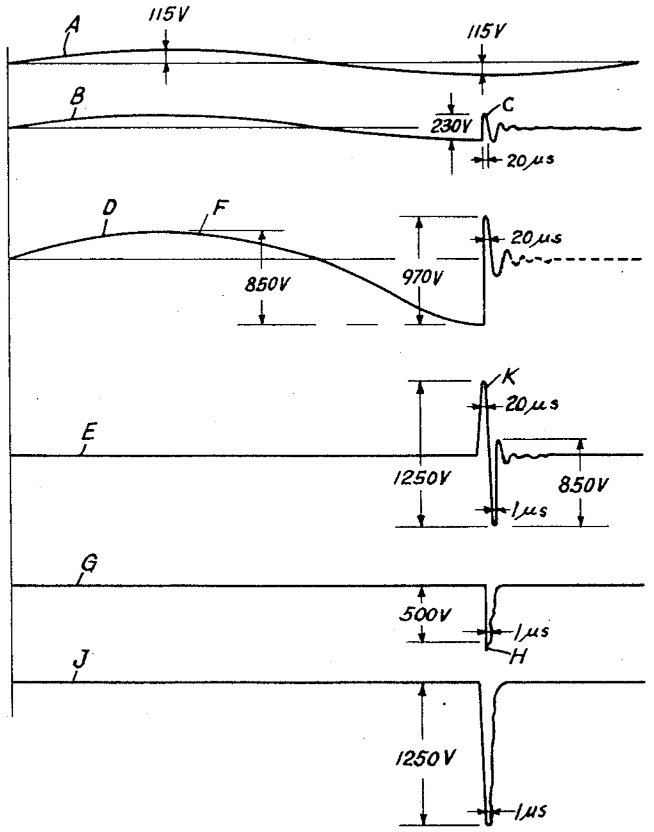
Fig. 2 is a drawing of the wave forms of the signals at various points in the circuit of this invention.
Figure 3:
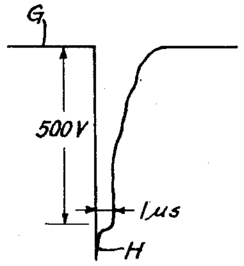
Fig. 3 is an expanded view of the wave form G shown in Fig. 2.
Figure 4:
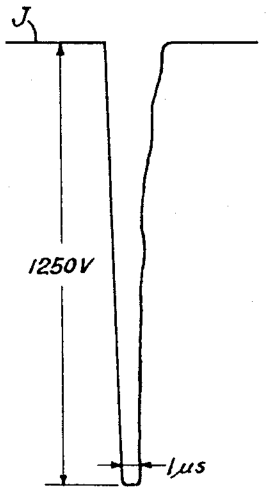
Fig. 4 is an expanded view of waveform J shown in Fig. 2.

Referring to Fig. 1 there is shown a charging inductance 1 coupling a signal source to the inductor winding 3 of a first saturable reactor 4 by means of capacitor 2. The output of inductor winding 3 is coupled to the input of the inductor winding 5 of a second saturable reactor 6 by means of capacitor 7. Capacitor 8 couples capacitor 7 and the output of inductor winding 3 to ground. Inductor winding 5 is tapped at points 9 and 10 to provide capacitive coupling to ground by means of capacitors 11 and 12, respectively. Pulse transformer 15 is coupled to the inductor winding 5 at point 16 and provides the output pulse of the circuit. A first polarizing winding 17 which is part of the first saturable reactor 4 is coupled to a source of direct current 18 by means of the inductance 19 which has a tap at point 20 dividing the inductance 19 into two inductors 21 and 22. A second polarizing winding 23, part of the second saturable reactor 6, is coupled to the same source of direct current 18 by the inductance 19. Capacitor 24 is shunted across the primary winding 25 of pulse transformer 15. Capacitors 26 and 27 are filter capacitors to keep alternating current out of the direct current circuit. Variable resistor 28 varies the direct current voltage delivered to the polarizing windings 17 and 23.

The operation of the circuit is as follows. The input signal A which is substantially a sine wave input is fed to the input of the charging inductance 1. The input circuit consisting of the charging inductance 1 and the capacitor 2 together with the reflected effect of capacitor 8 and neglecting the unsaturated inductance of inductor 3, since this inductor for the time being is acting as a transformer, is resonant at the input signal frequency and delivers a maximum voltage across capacitors 2 and 8 at point 32. Waveform B is the resonant signal and shows the effect of the polarizing field of reactor 4 on the positive sine cycle and the discharge excursion of inductor 3. The ringing C following this discharge has a duration of 20 to 30 microseconds before the inductor 5 discharges. At the instant the voltage reaches the maximum across capacitors 2, 8 and 7 at point 32, the inductor 3 becomes saturated and acts as a switch to transfer the charge of capacitors 2, 8 and 7 to the input of inductor 5. The circuit consisting of capacitor 8, capacitor 7 and inductor 3, neglecting the effect of the inductance of inductor 5, which has now become unsaturated, then becomes resonant to another frequency higher than the input frequency and the current flows rapidly. The waveform D is the output signal of inductor 3 and is a replica of waveform B multiplied by the turns ratio of inductor 3 acting as an auto-transformer. Waveform E is the input to inductor 5 and is a differentiated form of waveform D. The low frequency component of waveform D, which is the rounded portion F, has been removed. As the peak of the voltage across capacitors 7 and 8 is reached, inductor 5 saturates and the energy is transferred to the load, the pulse transformer 15, and this gives waveform G, the positive portion of waveform E having been removed by the polarizing effect of winding 23. The frequency of the output pulse of the inductor 5 is much higher than the second frequency and is determined basically by the values of the saturated inductance of inductor 5 and the capacitors 7 and 8 in series neglecting capacitor 24 which is of negligible capacity in comparison with capacitors 7 and 8 and therefore does not affect the resonance of the circuit.

In order to obtain a rectangular pulse in place of the otherwise triangular pulse, as shown in the negative portion of waveform E, it is necessary to incorporate a pulse forming network. The pulse forming action in accomplished by tapping the inductor 5 in at least two places 9 and 10 and shunting them to ground by capacitors 11 and 12. The pulse forming action may be varied by using more taps and more capacitors as may be desired. This means that once inductor 5 has been saturated and has performed its switching function, it becomes a three-section pulse forming network consisting of inductances 29, 30 and 31 and their associated shunt capacitors, capacitors 7 and 8 in series with inductance 29 as the first section, capacitor 11 with inductance 30 as the second section and capacitor 12 with inductance 31 constituting the third section. The selection of proper values of capacitors and inductances, and adjustment of the polarizing field will result in the transformation of the triangular pulse input E developed within inductor 5 into the rectangular pulse output G of inductor 5. Waveform G is a modified replica of the output pulse of inductor 5 as seen on the primary or input side of the pulse transformer 15. The substantially flat top is due to the pulse shaping action described above. This rectangular pulse has certain irregularities, such as the protuberance H, which are removed by the pulse shaping effect of capacitor 24 and the primary winding 25. In effect, by proper design of pulse transformer 15 to obtain the correct leakage inductance of the primary winding 25, and by using the proper value of shunting capacitor 24, a fourth section is added to the pulse forming network which provides additional wave shaping to obtain as the output of pulse transformer 15, the amplified flat top rectangular pulse J.

The function of the polarizing windings 17 and 23 is to allow adjustment of the magnetic flux field of the saturable reactors 4 and 6 so that maximum pulse permeability is obtained and saturation occurs on the peak of the voltage switch. The saturation of the saturable reactors 4 and 6 take place in one direction only due to the fact that it is subjected to a unidirectional polarizing flux. In other words the action of the polarizing flux may be compared with the grid bias effect on a vacuum tube to introduce cut-off or non-linearity in the output signal of the vacuum tube.

In this invention the tapped inductance 19 acts as a transformer, since there is mutual inductive coupling between the two inductors 21 and 22, and performs two functions. It serves (1) to prevent alternating current of the inductor circuits in the saturable reactors from flowing in the direct current polarizing circuit, and (2) cancels inter winding coupling which causes undesirable feedback of the output voltage excursions, and prevents them from reaching the input circuits. By locating the tap at 20 where the direct current polarizing current is fed up through the inductance 19, the resulting direct current fields within the inductance 19 itself can be made to cancel each other and thereby permit the use of a smaller magnetic core without saturating, at the same time maintaining the desired maximum of said inductance. The current to the polarizing windings 17 and 23 flows in opposite directions in the two inductors 21 and 22 of the inductance 19 and therefore produces counter acting direct current fields. The location of the tap 20 is made at the correct place so that the bucking fields are equal and therefore depends upon the shunt inductance required for each polarizing winding, the current it draws and the number of turns used in each inductor of the inductance 19. In other words, the opposing ampere turns must be equal. In a reduction to practice model, the number of turns in inductor 22 was twice the number of turns in inductor 21. Therefore, a pulse from point 16 which is induced in the polarizing winding 23 and fed into inductor 22, is transformed into a pulse of twice the voltage and negative polarity and will appear at point 32. Point 32 is located at the midpoint of a voltage divider made up of capacitors 7 and 8 which receives at point 33 a double sided pulse, waveform E. The transformed negative going pulse is in the proper phase and amplitude to cancel the positive portion K of the waveform E at point 33 and thus prevents it from reaching the input circuit.

The circuit of my invention has been reduced to practice with satisfactory results. Typical parameters chosen in the reduction to practice of the circuit of this invention are as follows.

| | |
|---|---|
| **2** | .33 mfd.—400 volts. |
| **7** | .011 mfd.—1000 volts. |
| **8** | .0011 mfd.—1000 volts. |
| **11, 12** | .0022 mfd.—1000 volts. |
| **24** | .001 mfd.—1000 volts. |
| **26, 27** | .001 mfd.—300 volts. |
| **1** | 30 mh.—adjustoroid—United Transformer Co. |
| **3** | 99.5 mh.—400 turns #28 wire tapped at 120 turns, core size—AE (Arnold Engineering) 5233–D1, inductance to tap 7.2 mh. |
| **17** | 52 mh.—300 turns #28 wire, core size AE 5233–D1. |
| **29, 30, 31** | 1.58 mh.—33 turns #28 wire, core size AE 5233–D1. |
| **23** | 2.95 mh.—70 turns #28 wire, core size AE 5233–D1. |
| **25** | 3.5 mh.—70 turns #28 wire, core size AE 5233–D1. |
| **34, 35** | 126 mh.—350 turns #26 wire, bifilar, core size AE 5233–D1. |
| **28** | 125 ohms, variable resistor, 10 watts. |

The frequency of the input sine wave is 2000 c.p.s., the resonant frequency of capacitor 8, capacitor 7 and inductor 3 is 25,000 c.p.s. and the resonant frequency of inductor 5, capacitor 7 and capacitor 8 is 500,000 c.p.s.

While I have described above the principles of my invention in connection with specific apparatus, it is to be clearly understood that this description is made only by way of example and not as a limitation to the scope of my invention as set forth in the objects thereof and in the accompanying claims.

I claim:

1. A magnetic pulse generating circuit comprising first and second saturable reactors, a source of undulating wave signals, input means coupling said signal source to said first reactor to produce a pulse output, means coupling the pulse output of said first reactor to said second reactor to decrease the rise and fall characteristics of said output pulse, means coupled in common to said first and second reactors to produce counteracting magnetic fields for said first and second reactors, and means coupled to said second reactor to amplify the pulse output of said second reactor and to flatten the top of said pulse output.

2. A magnetic pulse generating circuit comprising first and second saturable reactors, a source of undulating wave signals, input means coupling said signal source to said first reactor to produce a pulse output, means coupling the pulse output of said first reactor to said second reactor to decrease the rise and fall characteristics of said output pulse, means coupled in common to said first and second reactors to produce counteracting magnetic fields for said first and second reactors, the means coupled in common to said first and second reactors operating to develop in response to generation of an alternating current component in said second reactor a corresponding alternating current component of opposite polarity in the output of said first reactor to counteract feedback of any such generated alternating component from said second reactor to said input means.

3. A magnetic pulse generating circuit comprising first and second saturable reactors, a source of undulating wave signals, input means coupling said signal source to said first reactor to produce a pulse output, means coupling the pulse output of said first reactor to said second reactor to decrease the rise and fall characteristics of said output pulse, means coupled in common to said first and second reactors to produce counteracting magnetic fields for said first and second reactors, the means coupled in common to said first and second reactors operating to develop in response to generation of an alternating current component in said second reactor a corresponding alternating current component of opposite polarity in the output of said first reactor to counteract feedback of any such generated alternating component from said second reactor to said input means, a pulse transformer, means coupling the output of said second reactor to said pulse transformer to amplify said output pulse and to flatten the top thereof.

4. A magnetic pulse generating circuit comprising first and second saturable reactors, a source of undulating wave signals, input means coupling said signal source to said first reactor to produce a pulse output, capacitor means coupling the pulse output of said first reactor to said second reactor, capacitor means coupled to said second reactor to decrease the rise and fall characteristics of said output pulse, means coupled in common to said first and second reactors to produce counteracting magnetic fields for said first and second reactors, the means coupled in common to said first and second reactors operating to develop in response to generation of an alternating current component in said second reactor a corresponding alternating current component of opposite polarity in the output of said first reactor to counteract feedback of any such generated alternating current component from said second reactor to said input means, a pulse transformer, means coupling the output of said second reactor to said pulse transformer to amplify said output pulse and to flatten the top thereof.

5. A magnetic pulse generating circuit comprising first and second reactors each comprising an inductor winding and a polarizing winding, a source of undulating wave signals, input means coupling said signal source to the inductor winding of said first reactor to produce a pulse signal output, capacitor means coupling the pulse signal output of said first reactor to the inductor winding of said second reactor, capacitor means coupled to the inductor winding of said second reactor to decrease the rise and fall time characteristics of said pulse signal, an inductance winding, a source of direct current voltage coupled to said winding and dividing it into first and second inductors, said first inductor coupling said direct current voltage source to the first polarizing winding of said first reactor to provide a magnetic field for said first reactor, said second inductor coupling said direct current voltage source to the second polarizing winding of said second reactor to provide a magnetic field for said second reactor, said inductance winding being common to both said first and second reactors to develop in response to generation of an alternating current component in said second reactor a corresponding alternating current component of opposite polarity in the output of said first reactor to counteract feedback of any such generated alternating current component from said second reactor to said input means, a pulse transformer, capacitor means coupling the output of said second reactor to said pulse transformer to amplify said output pulse and to flatten the top thereof.

References Cited in the file of this patent

UNITED STATES PATENTS

| | | |
|---|---|---|
| 2,727,159 | Sunderlin | Dec. 13, 1955 |
| 2,753,517 | Hooper | July 3, 1956 |

FOREIGN PATENTS

| | | |
|---|---|---|
| 154,760 | Australia | Feb. 1, 1951 |